(12) United States Patent
Hsiao et al.

(10) Patent No.: US 11,209,924 B2
(45) Date of Patent: Dec. 28, 2021

(54) BEZEL-LESS TOUCH DISPLAY MODULE AND MANUFACTURING METHOD THEREOF

(71) Applicant: Huizhou China Star Optoelectronics Technology Co., Ltd., Huizhou (CN)

(72) Inventors: Yuchun Hsiao, Huizhou (CN); Xiaohong Jing, Huizhou (CN)

(73) Assignee: HUIZHOU CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 386 days.

(21) Appl. No.: 16/308,476

(22) PCT Filed: Sep. 14, 2018

(86) PCT No.: PCT/CN2018/105650
§ 371 (c)(1),
(2) Date: Dec. 9, 2018

(87) PCT Pub. No.: WO2019/214124
PCT Pub. Date: Nov. 14, 2019

(65) Prior Publication Data
US 2021/0081065 A1    Mar. 18, 2021

(30) Foreign Application Priority Data
May 8, 2018    (CN) .......................... 201810433040.3

(51) Int. Cl.
*G06F 3/041* (2006.01)
*H05K 1/18* (2006.01)

(52) U.S. Cl.
CPC ............ *G06F 3/0412* (2013.01); *H05K 1/189* (2013.01); *G06F 2203/04103* (2013.01); *H05K 2201/10128* (2013.01)

(58) Field of Classification Search
CPC ..... G06F 3/0412; G06F 3/0446; H05K 1/189; H05K 1/0373; G02F 1/1368; G02F 1/13452
See application file for complete search history.

(56) References Cited

U.S. PATENT DOCUMENTS

2007/0229475 A1    10/2007   Gettemy et al.
2011/0122334 A1*    5/2011   Tang ................ G02F 1/133308
                                                                    349/58
(Continued)

FOREIGN PATENT DOCUMENTS

CN    103729079 A    4/2014
CN    104777943 A    7/2015
(Continued)

*Primary Examiner* — Fred Tzeng
(74) *Attorney, Agent, or Firm* — Leong C. Lei (57) ABSTRACT

The present disclosure relates to a bezel-less touch display module and a manufacturing method thereof. The bezel-less touch display module includes: a display panel, a touch layer configured on the display panel, at least one flexible circuit board electrically connected to two sides of the touch layer, and packaging glue configured to enclose a lateral side of the touch layer and two sides of the flexible circuit board. As such, appearance of the touch display module may be improved by replacing the bezel by the packaging glue, and the demands of the appearance of the bezel-less products may be satisfied.

5 Claims, 7 Drawing Sheets

(56) References Cited

U.S. PATENT DOCUMENTS

| | | | | |
|---|---|---|---|---|
| 2013/0148072 A1* | 6/2013 | Jang | .................... | G02F 1/13452 |
| | | | | 349/150 |
| 2013/0280519 A1* | 10/2013 | Hsiao | ................... | H05K 1/0373 |
| | | | | 428/325 |
| 2014/0104509 A1* | 4/2014 | Fang | .................... | G06F 3/0446 |
| | | | | 349/12 |
| 2015/0257278 A1* | 9/2015 | Niskala | ................. | H05K 1/189 |
| | | | | 361/749 |
| 2016/0183387 A1* | 6/2016 | Tsunekawa | ....... | G02F 1/133308 |
| | | | | 361/749 |
| 2018/0081463 A1* | 3/2018 | Zhang | ................. | G02F 1/1368 |
| 2020/0183523 A1* | 6/2020 | Luo | ...................... | G06F 3/0412 |

FOREIGN PATENT DOCUMENTS

| | | |
|---|---|---|
| CN | 104407754 A | 11/2015 |
| CN | 105528026 A | 4/2016 |
| CN | 206058155 U | 3/2017 |
| CN | 107464823 A | 12/2017 |
| CN | 207051870 U | 2/2018 |
| CN | 107807476 A | 3/2018 |

* cited by examiner

BEZEL-LESS TOUCH DISPLAY MODULE AND MANUFACTURING METHOD THEREOF

FIELD OF THE INVENTION

The present disclosure relates to display field, more particularly to a bezel-less touch display module and a manufacturing method thereof.

BACKGROUND OF THE INVENTION

Thin film transistor (TFT) is the main driving component of liquid crystal displays (LCDs) and active matrix organic light-emitting diodes (AMOLEDs). The TFT directly relates to performance of flat display devices.

Most of the LCDs are backlit LCDs, including a LCD panel and a backlight module. The operation principle of the LCD panel is to configure liquid crystal molecules between the TFT array substrate and the color filter (CF), and to conduct a pixel voltage and a common voltage respectively on the two substrates. The direction of the liquid crystal molecules may be changed by the electrical field formed by the pixel voltage and the common voltage, so as to refract the light beams of the backlight module and to generate images.

With the development of the LCD, the touch screen has been widely adopted, and interactivity with the display screens has been demanded greatly. The conventional large-sized touch display module mainly includes infrared touch display modules and projected capacitive touch display modules. The infrared touch display modules have structural limitation in thickness, which brings the opportunity to the projected capacitive touch display modules. In order to make the thickness of the touch display module even thinner, a sensor film and a polyethylene terephthalate (PET) film are configured on the LCD display panel to form touch structure. Although the thickness of the bezel of the touch display module may become even thinner by the configuration of the sensor film and the PET film, the touch display module may still have the bezel.

SUMMARY OF THE INVENTION

The present disclosure provides a bezel-less touch display module. As such, appearance of the touch display module may be improved by replacing the bezel by the packaging glue, and the demands of the appearance of the bezel-less products may be satisfied.

The present disclosure further provides a manufacturing method of a bezel-less touch display module capable of replacing the bezel by the packaging glue. As such, appearance of the bezel-less touch display module may be improved and the demands of the appearance of the bezel-less products may be satisfied.

In one aspect, the present disclosure relates to a bezel-less touch display module, including: a display panel, a touch layer configured on the display panel, at least one flexible circuit board electrically connected to two sides of the touch layer, and packaging glue configured to enclose a lateral side of the touch layer and two sides of the flexible circuit board.

The flexible circuit board is bent toward the display panel.

A shape of an edge of the packaging glue facing away the touch layer is rectangular or arc-shaped.

The touch layer includes a first bonding layer configured on the display panel, a driving electrode (TX) layer configured on the first bonding layer, a second bonding layer configured on the TX layer, an induction electrode (RX) layer configured on the second bonding layer, a third bonding layer configured on the RX layer, a fourth bonding layer configured on the third bonding layer, and a polyester film layer configured on the fourth bonding layer; the flexible circuit board electrically connects to the TX layer and the RX layer respectively.

The first bonding layer, the second bonding layer, the third bonding layer, and the fourth bonding layer are optical adhesives (OCAs).

A thickness of the first bonding layer is configured to be 0.3 mm; a thickness of the second bonding layer, a thickness of the third bonding layer, and a thickness of the fourth bonding layer are configured to be 0.15 mm; a thickness of the TX layer and a thickness of the RX layer are configured to be 0.125 mm, a thickness of the polyester film layer is configured to be 0.2 mm, and a thickness of the flexible circuit board is configured to be 0.12 mm.

In another aspect, the present disclosure further relates to a manufacturing method of a bezel-less touch display module, including the following steps.

In step S1, providing a display panel, forming a touch layer on the display panel, forming the at least one flexible circuit board on two sides of the touch layer, and bending the flexible circuit board toward the flexible circuit board.

In step S2, forming a ring-shaped dispensing region on a lateral side of the touch layer and on the two sides of the flexible circuit board.

In step S3, filling a black-shading glue into the dispensing region, and after the black-shading glue being cured, the lateral side of the touch layer and the two sides of the flexible circuit board are enclosed by the black-shading glue.

The step S2 further includes the following steps.

In step S21, providing a dispensing jig, wherein the dispensing jig comprises a carrying platform and a ring-shaped baffle being configured on the carrying platform.

In step S22, fixing the touch layer on the carrying platform to be within the baffle, wherein the baffle, the lateral side of the touch layer, and the two sides of the flexible circuit board cooperatively define the ring-shaped dispensing region.

The step S2 further includes: forming a side mold on a periphery of the touch layer and the flexible circuit board via an injection molding process, wherein the side mold corresponds to the lateral side of the touch layer and a lateral side of the flexible circuit board to define the ring-shaped dispensing region, and a dispensing opening corresponding to the dispensing region is configured on the side mold.

A shape of an edge of the packaging glue facing away the touch layer is rectangular or arc-shaped.

In view of the above, the present disclosure relates to the bezel-less touch display module, including: the display panel, the touch layer configured on the display panel, at least one the flexible circuit board electrically connected to the two sides of the touch layer, and the packaging glue configured to enclose the lateral side of the touch layer and the two sides of the flexible circuit board. As such, the appearance of the bezel-less touch display module may be improved by replacing the bezel by the packaging glue, and the demands of the appearance of the bezel-less products may be satisfied. The present disclosure further relates to the manufacturing method of the bezel-less touch display module. By forming the dispensing region on the lateral side of the touch layer and on the two sides of the flexible circuit board, filling the black-shading glue into the dispensing region, and after the black-shading glue being cured, the lateral side of the touch layer and the two sides of the flexible circuit board are enclosed by the black-shading glue. As such, the packaging glue configured on the lateral side of the touch layer and the two sides of the flexible circuit board may be smooth, the manufacturing process may be simplified, and reliability of the manufacturing process may be improved. By replacing the bezel of the touch display module by the packaging glue, the appearance of the bezel-less touch display module may be improved, and the demands of the appearance of the bezel-less products may be satisfied.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

To clarify the purpose, technical solutions, and the advantages of the disclosure, embodiments of the invention will now be described more fully hereinafter with reference to the accompanying drawings.

Figure 1:
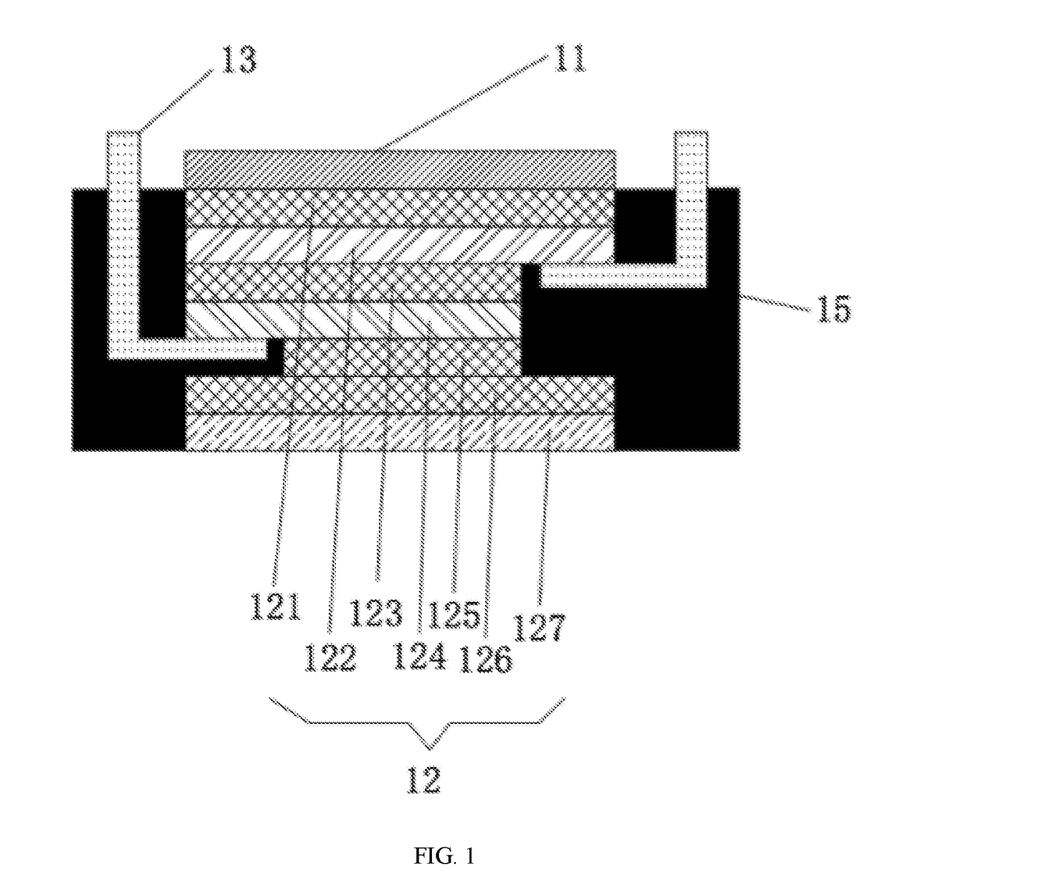
FIG. 1 is a schematic view of a bezel-less touch display module in accordance with one embodiment of the present disclosure.

Referring to FIG. 1, the present disclosure relates to a bezel-less touch display module, including: a display panel 11, a touch layer 12 configured on the display panel 11, at least one flexible circuit board 13 electrically connected to two sides of the touch layer 12, and packaging glue 15 configured to enclose a lateral side of the touch layer 12 and two sides of the flexible circuit board 13.

It is noted that the packaging glue 15 of the bezel-less touch display module is configured to enclose the lateral side of the touch layer 12 and the two sides the flexible circuit board 13. By replacing the bezel of the touch display module by the packaging glue, appearance of the touch display module may be improved, and the demands of the appearance of the bezel-less products may be satisfied.

Specifically, the flexible circuit board 13 is bent toward the display panel 11. As such, a width of the packaging glue 15 may be reduced, and the packaging glue 15 may become even thinner.

In one example, a shape of an edge of the packaging glue 15 facing away the touch layer 12 is rectangular or arc-shaped. As such, a rim of the bezel-less touch display module may become even more smooth and the appearance of the bezel-less touch display module may further be improved.

In one example, the packaging glue 15 may be a black-shading glue, and the black-shading glue may be UV456.

Specifically, the touch layer 12 may include a first bonding layer 121 configured on the display panel 11, a driving electrode (TX) layer 122 configured on the first bonding layer 121, a second bonding layer 123 configured on the TX layer 122, an induction electrode (RX) layer 124 configured on the second bonding layer 123, a third bonding layer 125 configured on the RX layer 124, a fourth bonding layer 126 configured on the third bonding layer 125, and a polyester film layer 127 configured on the fourth bonding layer 126. The flexible circuit board 13 electrically connects to the TX layer 122 and the RX layer 124 respectively, and the flexible circuit board 13 is configured to provide electrical signals to the TX layer 122 and the RX layer 124.

In one example, the first bonding layer 121, the second bonding layer 123, the third bonding layer 125, and the fourth bonding layer 126 may be optical adhesives (OCAs). A thickness of the first bonding layer 121 may be 0.3 mm. A thickness of the second bonding layer 123, a thickness of the third bonding layer 125, and a thickness of the fourth bonding layer 126 may be 0.15 mm. A thickness of the TX layer 122 and a thickness of the RX layer 124 may be 0.125 mm. A thickness of the polyester film layer 127 may be 0.2 mm. A thickness of the flexible circuit board 13 may be 0.12 mm.

In one example, the packaging glue 15 is configured to enclose the lateral side of the touch layer 12 and the two sides of the flexible circuit board 13. In another example, the packaging glue 15 may enclose a periphery of the display panel 11, the touch layer 12, and the flexible circuit board 13 to form the packaging glue 15 of the touch display module. However, the present disclosure is not limited thereto.

Figure 2:
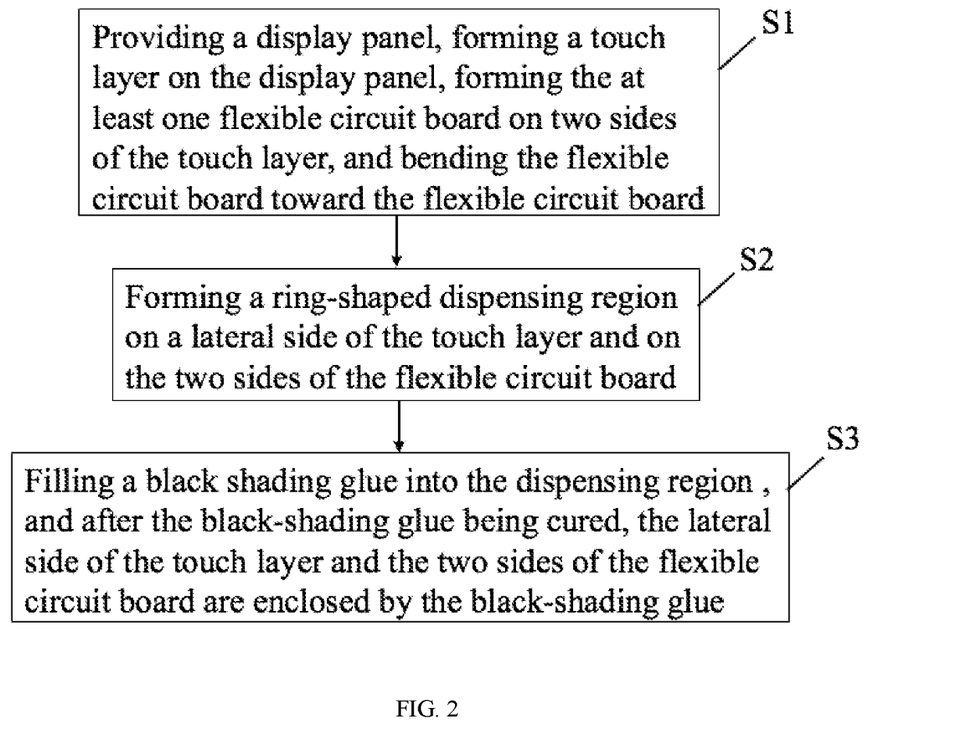
FIG. 2 is a flowchart illustrating a manufacturing method of a bezel-less touch display module in accordance with one embodiment of the present disclosure.

Referring to FIG. 2, the present disclosure further relates to a manufacturing method of a bezel-less touch display module, including the following steps.

Figure 3:
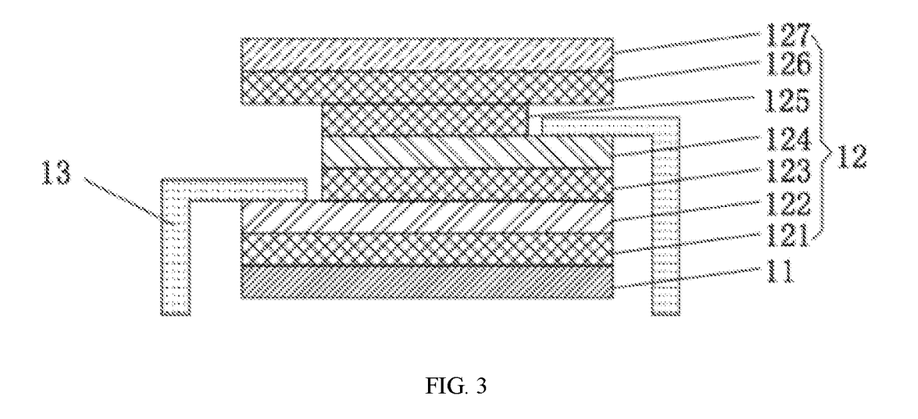
FIG. 3 is a schematic view illustrating step S1 of the manufacturing method of the bezel-less touch display module in accordance with one embodiment of the present disclosure.

In step S1, referring to FIG. 3, providing the display panel 11, forming the touch layer 12 on the display panel 11, forming the at least one flexible circuit board 13 on the two sides of the touch layer 12, and bending the flexible circuit board 13 toward the flexible circuit board 13.

In step S2, forming a ring-shaped dispensing region 14 on the lateral side of the touch layer 12 and on the two sides of the flexible circuit board 13.

In step S3, filling a black-shading glue into the dispensing region 14, and after the black-shading glue being cured, the lateral side of the touch layer 12 and the two sides of the flexible circuit board 13 are enclosed by the packaging glue 15.

It is noted that by forming the dispensing region 14 on the lateral side of the touch layer 12 and the two sides of the flexible circuit board 13, filling the black-shading glue into the dispensing region, and forming the packaging glue 15 enclosing the lateral side of the touch layer 12 and the two sides of the flexible circuit board 13, the packaging glue 15 configured on the lateral side of the touch layer 12 and the two sides of the flexible circuit board 13 may be smooth, the manufacturing process may be simplified, and reliability of the manufacturing process may be improved. By replacing the bezel of the touch display module by the packaging glue 15, the appearance of the touch display module may be improved, and the demands of the appearance of the bezel-less products may be satisfied.

Specifically, the touch layer 12 may include the first bonding layer 121 configured on the display panel 11, the TX layer 122 configured on the first bonding layer 121, the second bonding layer 123 configured on the TX layer 122, the RX layer 124 configured on the second bonding layer 123, the third bonding layer 125 configured on the RX layer 124, the fourth bonding layer 126 configured on the third bonding layer 125, and the polyester film layer 127 configured on the fourth bonding layer 126. The flexible circuit board 13 electrically connects to the TX layer 122 and the RX layer 124 respectively, and the flexible circuit board 13 is configured to provide the electrical signals to the TX layer 122 and the RX layer 124.

In one example, the first bonding layer 121, the second bonding layer 123, the third bonding layer 125, and the fourth bonding layer 126 may be the OCAs. The thickness of the first bonding layer 121 may be 0.3 mm. The thickness of the second bonding layer 123, the thickness of the third bonding layer 125, and the thickness of the fourth bonding layer 126 may be 0.15 mm. The thickness of the TX layer 122 and the thickness of the RX layer 125 may be 0.125 mm. The thickness of the polyester film layer 127 may be 0.2 mm. The thickness of the flexible circuit board 13 may be 0.12 mm.

In one example, the black-shading glue may be UV456.

In one example, in the step S3, the manufacturing method may further include a step of heating the black-shading glue, so as to improve fluidity of the black-shading glue.

Figure 4:
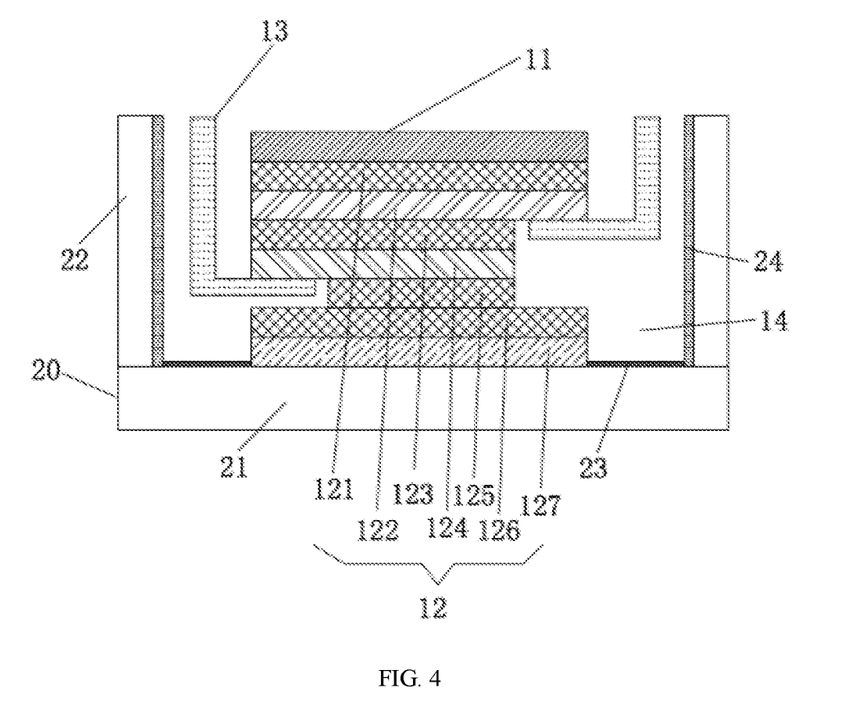
FIG. 4 is a schematic view illustrating step S2 of the manufacturing method of the bezel-less touch display module in accordance with first embodiment of the present disclosure.
Figure 5:
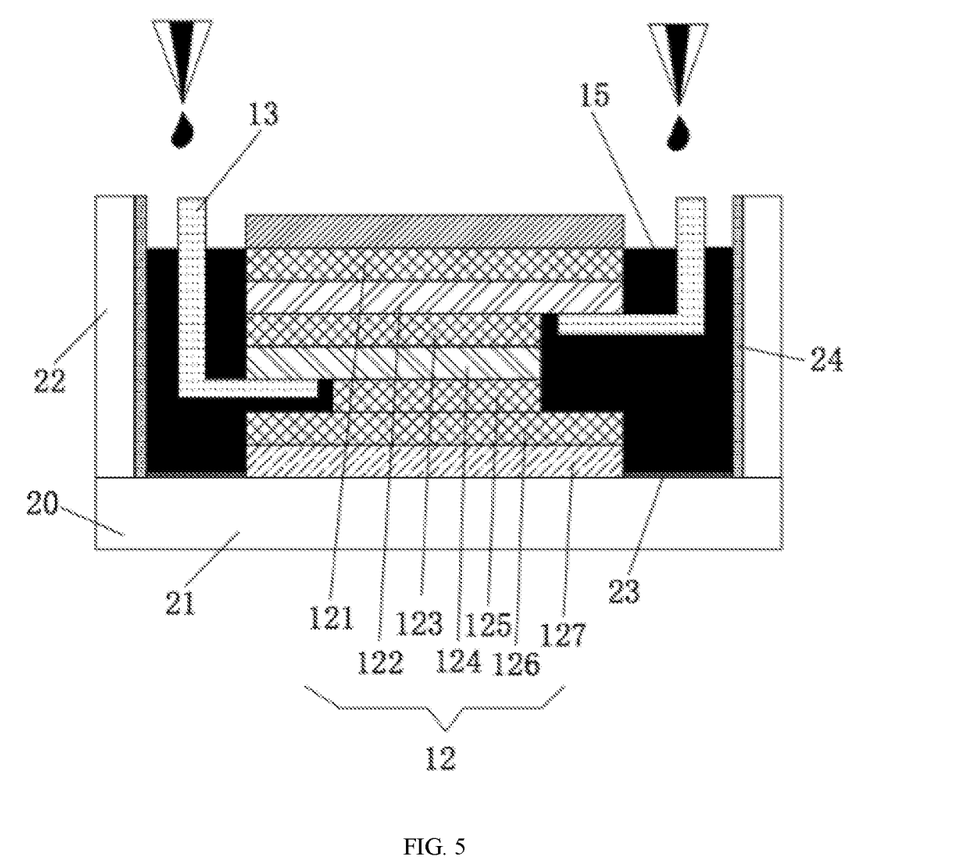
FIG. 5 is a schematic view illustrating step S3 of the manufacturing method of the bezel-less touch display module in accordance with the first embodiment of the present disclosure.

Referring to FIG. 4 and FIG. 5, the step S2 may further include the following steps.

In step S21, providing a dispensing jig 20, wherein the dispensing jig 20 includes a carrying platform 21 and a ring-shaped baffle 22 configured on the carrying platform 21.

In step S22, fixing the touch layer 12 on the carrying platform 21 to be within the baffle 22, wherein the baffle 22, the lateral side of the touch layer 12, and the two sides of the flexible circuit board 13 cooperatively define the ring-shaped dispensing region 14.

Specifically, in the step S22, the touch layer 12 may be fixed on the carrying platform 21 by conducting a vacuum adsorption, and a pressure of the vacuum adsorption is adjustable.

In one example, the carrying platform 21 may be a transparent glass. In the step S3, a curing process may be conducted on the black-shading glue from a side of the carrying platform 21 facing away from the touch layer 12 to guarantee to appearance of the packaging glue 15 to be cured and smooth.

In one example, in the step S3, the manufacturing method may further include a step of separating the packaging glue 15 from the dispensing jig 20 after forming the packaging glue 15. A non-stick coating layer 23 is configured on a side of the carrying platform 21 facing toward the dispensing region 14. A Teflon cushion layer 24 is configured on a side of the baffle 22 facing toward the dispensing region 14. The Teflon cushion layer 24 may facilitate the separation of the packaging glue 15 and the dispensing jig 20, as such damages may not be caused on the packaging glue 15 during the separation.

Figure 6:
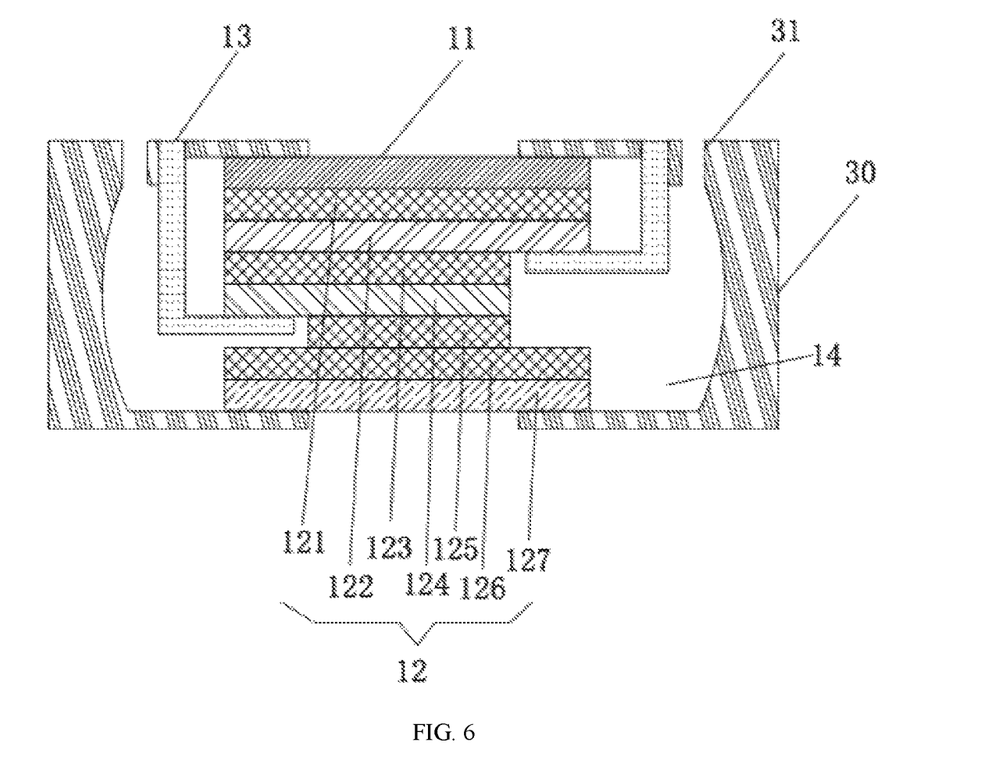
FIG. 6 is a schematic view illustrating step S2 of the manufacturing method of the bezel-less touch display module in accordance with second embodiment of the present disclosure.
Figure 7:
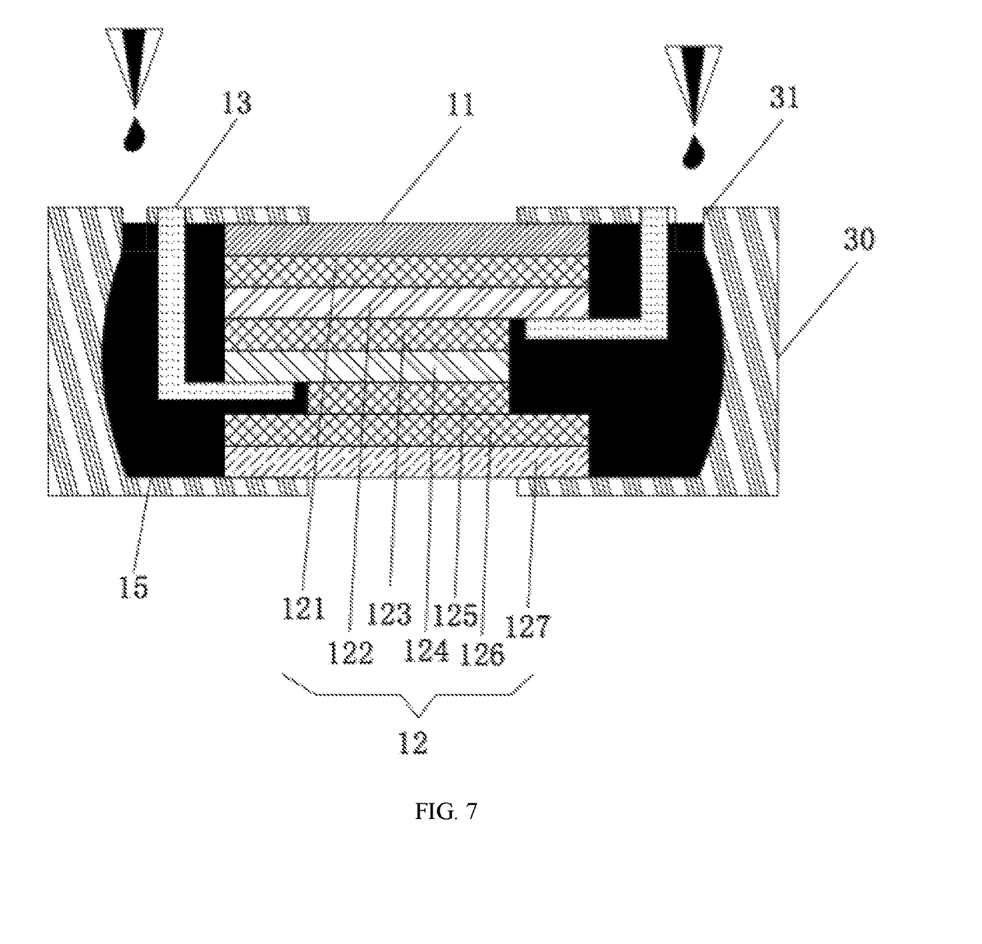
FIG. 7 and FIG. 8 are schematic views illustrating step S3 of the manufacturing method of the bezel-less touch display module in accordance with the second embodiment of the present disclosure.
Figure 8:
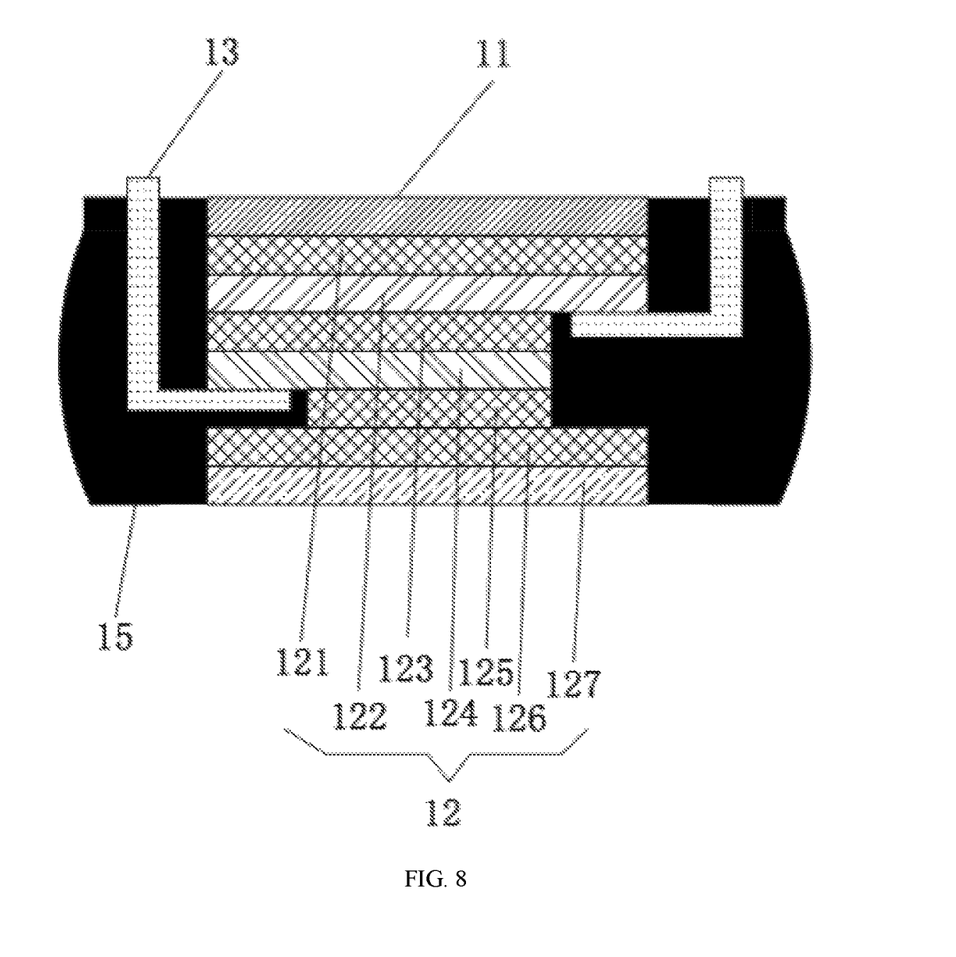

In one example, referring to FIG. 6 to FIG. 8, in the step S2, the manufacturing method may further include a step of forming a side mold 30 on the periphery of the touch layer 12 and the flexible circuit board 13 via an injection molding process. The side mold 30 is configured to be a ring-shaped cavity, which is configured to be the dispensing region 14, corresponding to the lateral side of the touch layer 12 and a lateral side of the flexible circuit board 13. A dispensing opening 31 corresponding to the dispensing region 14 is configured on the side mold 30.

Specifically, in the step S3, the manufacturing method may further include a step of demolding the packaging glue 15 from the side mold 30 after forming the packaging glue 15.

In one example, the packaging glue 15 is configured to enclose the lateral side of the touch layer 12 and the two sides of the flexible circuit board 13. In another example, the packaging glue 15 may enclose the periphery of the display panel 11, the touch layer 12, and the flexible circuit board 13 to form the packaging glue 15 of the touch display module. However, the present disclosure is not limited thereto.

In view of the above, the present disclosure relates to the bezel-less touch display module, including: the display panel, the touch layer configured on the display panel, at least one the flexible circuit board electrically connected to the two sides of the touch layer, and the packaging glue configured to enclose the lateral side of the touch layer and the two sides of the flexible circuit board. As such, the appearance of the bezel-less touch display module may be improved by replacing the bezel by the packaging glue, and the demands of the appearance of the bezel-less products may be satisfied. The present disclosure further relates to the manufacturing method of the bezel-less touch display module. By forming the dispensing region on the lateral side of the touch layer and on the two sides of the flexible circuit board, filling the black-shading glue into the dispensing region, and after the black-shading glue being cured, the lateral side of the touch layer and the two sides of the flexible circuit board after are enclosed by the black-shading glue, the packaging glue configured on the lateral side of the touch layer and the two sides of the flexible circuit board may be smooth, the manufacturing process may be simplified, and reliability of the manufacturing process may be improved. By replacing the bezel of the touch display module by the packaging glue, the appearance of the bezel-less touch display module may be improved, and the demands of the appearance of the bezel-less products may be satisfied.

The figure and the embodiment described according to figure are only for illustration, and the present disclosure is not limited to these embodiments. All other embodiments obtained by a person of ordinary skill in the art based on the embodiments of the present disclosure without creative efforts shall fall within the protection scope of the present disclosure.

What is claimed is:
1. A bezel-less touch display module, comprising:
   a display panel;
   a touch layer configured on the display panel, wherein the touch layer comprises a first bonding layer configured on the display panel, a driving electrode (TX) layer configured on the first bonding layer, a second bonding layer configured on the TX layer, an induction electrode (RX) layer configured on the second bonding layer, a third bonding layer configured on the RX layer, a fourth bonding layer configured on the third bonding layer, and a polyester film layer configured on the fourth bonding layer;
a first flexible circuit board electrically connecting to the driving electrode (TX) layer;
a second flexible circuit board electrically connecting to an introduction electrode (RX) layer; and
packaging glue configured to enclose a lateral side of the touch layer.

2. The bezel-less touch display module according to claim 1, wherein the flexible circuit board is bent toward the display panel.

3. The bezel-less touch display module according to claim 1, wherein a shape of an edge of the packaging glue facing away the touch layer is rectangular or arc-shaped.

4. The bezel-less touch display module according to claim 1, wherein the first bonding layer, the second bonding layer, the third bonding layer, and the fourth bonding layer are optical adhesives (OCAs).

5. The bezel-less touch display module according to claim 1, wherein a thickness of the first bonding layer is configured to be 0.3 mm; a thickness of the second bonding layer, a thickness of the third bonding layer, and a thickness of the fourth bonding layer are configured to be 0.15 mm; a thickness of the TX layer and a thickness of the RX layer are configured to be 0.125 mm, a thickness of the polyester film layer is configured to be 0.2 mm, and a thickness of the flexible circuit board is configured to be 0.12 mm.

* * * * *